(12) United States Patent
Gühring et al.

(10) Patent No.: US 8,005,274 B2
(45) Date of Patent: Aug. 23, 2011

(54) METHOD FOR DETERMINING MIDPOINT COORDINATES OF AN IMAGE OF A POINT-SYMMETRICAL STRUCTURE

(75) Inventors: Jens Gühring, Monmouth Junction, NJ (US); Arne Littmann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1339 days.

(21) Appl. No.: 11/584,991

(22) Filed: Oct. 23, 2006

(65) Prior Publication Data

US 2007/0092131 A1 Apr. 26, 2007

(30) Foreign Application Priority Data

Oct. 24, 2005 (DE) .................. 10 2005 050 858

(51) Int. Cl.
*G06K 9/00* (2006.01)
*G01V 3/00* (2006.01)
(52) U.S. Cl. .................. 382/123; 382/151; 324/312
(58) Field of Classification Search .................. 382/123, 382/151, 154, 173; 324/312, 317
See application file for complete search history.

(56) References Cited

U.S. PATENT DOCUMENTS

| 5,036,280 | A | | 7/1991 | Chesavage |
| 5,185,809 | A | * | 2/1993 | Kennedy et al. ............... 382/131 |
| 5,189,711 | A | * | 2/1993 | Weiss et al. .................. 382/203 |
| 5,545,995 | A | | 8/1996 | Schneider et al. |
| 5,923,776 | A | * | 7/1999 | Kamgar-Parsi ............... 382/173 |
| 2002/0110268 | A1 | | 8/2002 | Brinker et al. |
| 2005/0024051 | A1 | | 2/2005 | Doddrell et al. |

FOREIGN PATENT DOCUMENTS

DE 101 07 421 A1 9/2002

OTHER PUBLICATIONS

Mark Holden, Marcel Breeuwer, Kate Mc Leish, David J. Hawkes, Stephen F. Keevil, Derek L.G. Hill; "Sources and correction of higher order geometrical distortion for serial MR brain imaging"; Proceedings of SPIE; 2001; pp. 1-10; vol. 4322.
Marcel Breeuwer, Mark Holden and Waldemar Zylka; "Detection and correction of geometric distortion in 3D MR images", Proceedings of SPIE; 2001; pp. 1110-1120; vol. 4322.
Marcel Breeuwer, Waldemar Zylka, John Wadley, Andreas Falk; "Detection and Correction of Geometric Distortion in 3D CT/MR Images"; Paper Cars 1999; Jun. 23-26, 2999; pp. 5; Paris, France.

* cited by examiner

*Primary Examiner* — Louis M Arana

(57) ABSTRACT

The invention relates to a method for determining midpoint coordinates of an image of a point-symmetrical structure stored in a volume data record, comprising: extracting a partial volume data record from the volume data record which contains the image of the point-symmetrical structure, selecting a set of points whose coordinates lie in the partial volume data record, determining a measure for each point of the set wherein the measure for each of the points of the set characterizes in each case the symmetry of the partial volume data record in relation to this point, selecting a point as a midpoint of the point-symmetrical structure that point of the set in relation to which the partial volume data record has the greatest symmetry on the basis of the previously determined measures, and storing the coordinates of the midpoint in a computer unit.

20 Claims, 5 Drawing Sheets

METHOD FOR DETERMINING MIDPOINT COORDINATES OF AN IMAGE OF A POINT-SYMMETRICAL STRUCTURE

CROSS REFERENCE TO RELATED APPLICATIONS

This application claims priority of German application No. 10 2005 050 858.8 filed Oct. 24, 2005, which is incorporated by reference herein in its entirety.

FIELD OF THE INVENTION

The invention relates to a method for determining midpoint coordinates of an image of a point-symmetrical structure, said image being stored in a volume data record. Such point-symmetrical structures are found in particular in the case of phantoms, on the basis of which geometrical distortions are determined using magnetic resonance tomographs.

BACKGROUND OF THE INVENTION

During recent years, magnetic resonance tomography (MR tomography) has established itself as a significant imaging method in medicine. MR imaging systems which generate sectional views of an object to be examined, in particular a human body or body part, using nuclear magnetic resonances are known per se. In this type of activity, the body to be examined is introduced into a strong homogeneous static magnetic field, this being known as the main magnetic field, which effects an alignment of the nuclear spin of atomic nuclei within the body, in particular hydrogen atomic nuclei (protons) which are bound to water. Said nuclei are then excited into a precessional motion by means of high-frequency excitation pulses. After the end of a corresponding high-frequency (HF) excitation pulse, the atomic nuclei precess with a frequency (the so-called Larmor frequency) which depends on the strength of the main magnetic field, and then settle down after a predefined tissue-dependent relaxation time into the preferred direction which is predetermined by the main magnetic field. Using computational and/or metrological analysis of the integral high-frequency nuclear signals, a picture relating to a body layer can be generated from the spatial spin density or the distribution of the relaxation times. The assignment of the nuclear resonance signal, which can be seen as a result of the precessional motion, to the location of its occurrence is done by applying linear field gradients. For this, corresponding gradient fields are superimposed on the main magnetic field and controlled such that an excitation of the nuclei only occurs in a layer which is to be depicted. An HF coil apparatus is required both for the HF excitation of the nuclear spin and for the detection of the nuclear response signal. Imaging systems which are based on these physical effects are also referred to using the terms nuclear-spin tomography, nuclear magnetic resonance (NMR) tomography or magnetic resonance imaging (MRI).

Variations of the magnetic fields, in particular the spatial distribution of the magnetic field strengths, from their theoretically predetermined and calculated values cause geometric distortions in the picture. In particular, methods which are based on a quantitatively precise geometric representation of the areas to be examined are considerably impaired in respect of their quality as a result of such distortions.

It is possible primarily to identify four different causes which result in geometric distortion:

The magnetic susceptibility varies in the case of different materials and thus gives rise to a slight material-dependent modification of the main magnetic field.

Static magnetic field homogeneities are largely equalized by the so-called shimming of the magnetic field, but slight residual inhomogeneities can nonetheless remain.

Non-linearities of the gradient coils cause distortions in all directions. Gradient coils are usually designed in such a way as to minimize such distortions in the isocenter of the device. Consequently, such effects primarily occur in the marginal areas of MRT pictures.

Eddy currents are always produced in conductive materials when modifications of the magnetic fields are carried out. This primarily occurs when switching the gradient fields. In this case the strength and the spatial distribution of the eddy currents depend on the MRT sequence which is applied. In turn, the eddy currents themselves cause magnetic fields which overlie other magnetic fields and therefore cause geometric distortions.

One possibility for detecting geometric distortions which occur in the case of a specified MRT sequence is the use of a phantom. Such phantoms generally have a three-dimensional lattice of structures which are shown clearly in an MRT picture. Using an image of the phantom, the image of the three-dimensional lattice can be compared with the original lattice. This allows the creation of a distortion map which identifies the strength and the direction of the geometric distortions at various spatial points. This distortion map is used for correcting geometric distortions in the context of pictures which are subsequently recorded using the same MRT sequence.

Phantoms which are suitable for such a method generally exhibit structures which are easily and reliably identified, e.g. spheres, at the lattice points. An exact and reproducible specification of the position of the spheres, e.g. their midpoints, in an image of the phantom is necessary in this case in order to capture distortions.

Phantoms whose three-dimensional lattice is formed of spheres are disclosed in M. Breeuwer et al., "Detection and correction of geometric distortion in 3D MR images", Proc. SPIE 4322, 1110-1120, 2001, and in M. Holden et al. "Sources and correction of higher order geometrical distortion for serial MR brain imaging", Proc. SPIE 4322, 69-78, 2001. In these documents, as a midpoint of the spheres, only the central area of the sphere is specified in the image of a sphere, after the image of a sphere has been modified by a series of morphological erosion and dilatation operations to such an extent that additionally interfering structures—such as connections between the spheres—are removed from the image. However, the images of the spheres are also modified as a result of the erosion and dilatation operations, presenting the risk that the central area of the sphere will also be displaced in the case of spheres which are depicted in a distorted manner.

U.S. Pat. No. 5,545,995 A discloses a calibration method for correcting geometrical imaging errors, which are caused by gradient field non-linearities and by magnetic field inhomogeneities, in an MR image with reference to a three-dimensional scan of a phantom. The phantom contains an array of conical rods which generate an array of corresponding images in reconstructed picture layers. The size of the corresponding images and their position allow the measurement of positional errors and the creation of correction factors for subsequently acquired images of patients.

US 2005/0024051 A1 likewise discloses a method for correcting distorted pictures whose distortions are caused by non-linear gradient fields and translational, rotational, and/or winding or design errors of gradient coils. In this context, developments of surface spherical harmonics of the gradient fields and rapid Fourier transformation techniques are used in order to produce corrected pictures.

DE 101 07 421 A1 and the corresponding US 2002/0110268 A1 disclose in each case a method for detecting imaging distortions in an image. A first region of the imaging volume is shown free of distortion in the imaging, while a second region is distorted. The method works using at least three markings which show a known spatial position relative to each other and of which two markings are located in the first region of the imaging volume. Distortions in the image can be inferred from the position of the markings relative to each other.

SUMMARY OF THE INVENTION

The present invention addresses the problem of specifying a method by means of which the coordinates of the midpoint of an image of a point-symmetrical structure, in particular a spherical structure, can be captured more accurately in a simple, rapid and reproducible manner.

The problem is solved according to the claims.

Advantageous embodiments of the device are in each case the subject matter of further claims.

The method according to the invention for determining midpoint coordinates of an image of a point-symmetrical structure, said image being stored in a volume data record, as claimed the claims has the following method steps:
a) extracting a partial volume data record from the volume data record which contains the image of the point-symmetrical structure,
b) selecting a set of points whose coordinates lie in the partial volume data record,
c) determining a measure for each point of the set, wherein the measure for each of the points of the set characterizes in each case the symmetry of the partial volume data record in relation to this point,
d) selecting as midpoint of the point-symmetrical structure that point of the set in relation to which the partial volume data record has the greatest symmetry, on the basis of the previously determined measures,
e) storing the coordinates of the midpoint in a computer unit.

On the basis of such a method, a partial volume data record is initially selected from the volume data record in the first method step a). The partial volume data record contains the image of the point-symmetrical structure without further structures or images of further point-symmetrical structures which would disrupt the point symmetry of the object which is depicted in the partial volume data record. In the case of such a "pruned" partial volume data record, the fact is now exploited that the partial volume data record, like the point-symmetrical structure, exhibits a point symmetry.

In the method steps b) to e) following thereupon, the point of symmetry of the partial volume data record is determined as the midpoint of the structure. For this purpose, a plurality of points whose coordinates lie in the partial volume data record are tested as possible midpoints. For each of these points, a measure is determined which characterizes the symmetry of the partial volume data record with reference to this point. On the basis of this measure, that point with reference to which the partial volume data record has the greatest symmetry is determined. Its coordinates are stored in a computer unit for further processing. It is thus possible, e.g. in the context of MRT imaging, to determine the midpoint coordinates of the point-symmetrical structure in the case of different sequences. Sequence-dependent geometric distortions can also be detected as a result of this.

In an advantageous embodiment the volume data record is subjected to filtering, preferably smoothing by means of a Gaussian filter, before application of the method steps. This reduces inaccuracies during the subsequent midpoint specification, said inaccuracies being caused by random noises in the imaging volume. Since the Gaussian filter is applied as a symmetrical filter, the midpoint is not displaced by the filtering.

The search for the midpoint can be significantly accelerated by appropriate selection of the set of points which are tested as possible midpoints. For example, those points which are tested as possible test points can be a subset of the voxels of the partial volume data record which are situated around the volume central area of the partial volume data record. In this case the coordinates of the points need not necessarily correspond to the coordinates of the voxels of the partial volume data record. In this way the search for the midpoint of the point-symmetrical structure can also take place in a resolution which is less than the resolution which is predetermined by the voxels.

In a preferred embodiment, the set of points which are tested as possible midpoints lie on a straight line. As a result of limiting the points which are tested as midpoints to a one-dimensional structure, the search for the midpoint can be carried out significantly faster than a search in which the points of a two or three-dimensional set are tested.

The straight line along which the set of points is arranged is positioned as closely as possible through the midpoint of the point-symmetrical structure. In order to achieve this, two-dimensional layer pictures are advantageously extracted from the partial volume data record. An intensity-value-weighted center of area is then determined in each of the two-dimensional layer pictures. Finally, the straight line is positioned on the intensity-value-weighted centers of area as a regression line.

In this case the three-dimensional regression line is determined from two two-dimensional regression lines, each of which is positioned at a coordinate of the centers of area depending on the sequence direction of the two-dimensional layer pictures.

For each point in the set, a measure is now determined which characterizes the symmetry of the partial volume data record with reference to the point. In order to determine the measure for a specific point, a preferred embodiment of the invention provides for mirroring the partial volume data record at the specific point such that a mirrored partial volume data record is obtained. The measure for the specific point is determined by evaluating the similarity between the partial volume data record and the mirrored partial volume data record. Measures of similarity, for example, such as those used for comparing two images in the context of image processing, are suitable for use as a measure.

If a point which is tested as a possible midpoint lies close to the actual midpoint of the point-symmetrical structure, the mirrored partial volume data record will only differ slightly from the original partial volume data record. However, if a point which is tested as a possible midpoint lies far removed from the actual midpoint, the mirrored partial volume data record and the original partial volume data record differ to a greater extent.

Since the partial volume data record is characterized by voxels which have a specific intensity value in each case, a preferred embodiment of the invention provides for carrying out the mirroring of the partial volume data record at a specific point by means of mirroring of the individual voxels at the specific point. The evaluation of the similarity between the partial volume data record and the mirrored partial volume data record can then be carried out easily by comparing the intensity value of each voxel with the intensity values at the location of its corresponding mirrored voxel.

If the location of a mirrored voxel does not correspond exactly to the location of a voxel in the original partial volume data record, in an advantageous embodiment the intensity value at the location of the mirrored voxel is calculated from the intensity values of the surrounding voxels by means of interpolation.

In a preferred embodiment, the measure which evaluates the similarity between the partial volume data record and the mirrored partial volume data record is calculated from the differences which are formed from the intensity values of the voxels and from the intensity values at the locations of the mirrored voxels. These differences can be squared and summed, for example. However, their absolute value can also be summed. In each of these cases, the measure becomes minimal for that point which comes closest to the midpoint of the point-symmetrical structure, since the mirrored partial volume data record differs least from the original partial volume data record in this case and therefore the intensity value differences are smallest.

A volume data record can contain the image of not just one, but the images of a plurality of point-symmetrical structures. This occurs e.g. in the case of phantoms for calibrating medical imaging systems in which the point-symmetrical structures form a three-dimensional lattice. In this case the method steps for determining the midpoint coordinates of a point-symmetrical structure are advantageously carried out for each of the point-symmetrical structures individually. This can take place iteratively, in that the partial volume data record is selected such that it only contains the image of one of the point-symmetrical structures, and that it contains another point-symmetrical structure in each case for determining the midpoint in each iterative step.

In addition to the point-symmetrical structures, further structures are often depicted in the volume data record. For example, such structures can be support constructions which arrange the individual point-symmetrical structures in the phantom, or connections between the individual point-symmetrical structures. These further structures are usually also represented in an image of the phantom and can influence the method step of extracting the partial volume data record, such that the automatic selection of a correctly positioned and dimensioned partial volume data record cannot be performed easily.

In order to carry out the method step of extracting the partial volume data records from the volume data record in a stable and reliable manner, a preferred embodiment variant provides for the volume data record to be preprocessed such that the point-symmetrical structures are clearly differentiable in the preprocessed volume data record. By virtue of the differentiable point-symmetrical structures, the partial volume data record can be positioned and dimensioned such that it only contains the image of one of the point-symmetrical structures in each case.

For this purpose, structures whose geometry lies outside of a tolerance range are advantageously removed from the volume data record during the preprocessing of the volume data record. In this case, the tolerance range is adapted to the geometry of the point-symmetrical structures such that the images of the point-symmetrical structures remain in the volume data record while further structures which have a different geometry to that of the point-symmetrical structures are removed from the volume data record.

In a development of the preprocessing, the removal of the interfering structures from the volume data record takes place in two-dimensional layer pictures of the volume data record. For this, the color depth of a two-dimensional layer picture can be reduced to 1 bit. The resulting structures can then be evaluated easily according to their shape, size and/or position, and removed from the two-dimensional layer picture if their shape, size and/or position in each case lie outside of a predefined tolerance range.

In a further embodiment variant of the preprocessing, the removal of the interfering structures from the volume data record takes place in the three-dimensional volume data record. In this context it is now possible to apply other evaluation criteria which are based on the three-dimensional geometry of the structures, e.g. the evaluation of the depth of a three-dimensional structure or its position in the volume data record.

In a preferred embodiment, the point-symmetrical structures to be examined are spherical structures which are advantageously arranged in a phantom. In this case their materials are obtained such that the phantom is suitable for imaging using a magnetic resonance tomograph.

BRIEF DESCRIPTION OF THE DRAWINGS

The method according to the invention and advantageous embodiments according to the features of the independent claims are explained in greater detail below, but without thereby restricting the scope of the invention, with reference to schematically illustrated exemplary embodiments in the drawing, in which:

DETAILED DESCRIPTION OF THE INVENTION

Figure 1:
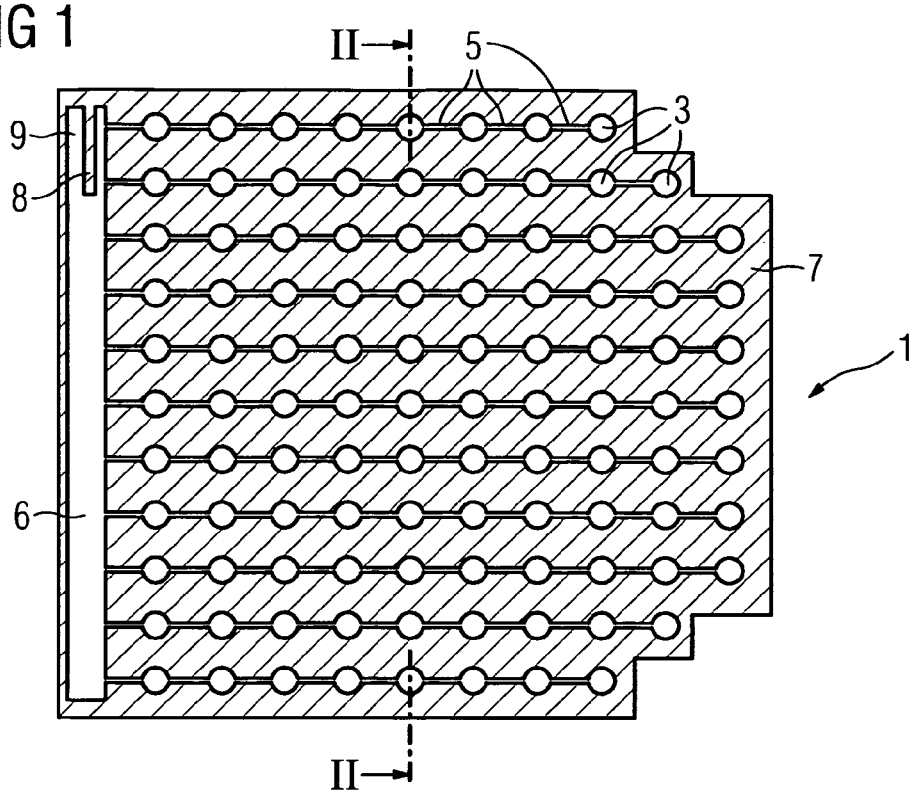
FIG. 1 and FIG. 2 show a longitudinal section and a cross section, respectively, through a phantom having a lattice structure which is formed of spheres, FIG. 3 schematically shows the partial steps which are applied when carrying out the method.
Figure 2:
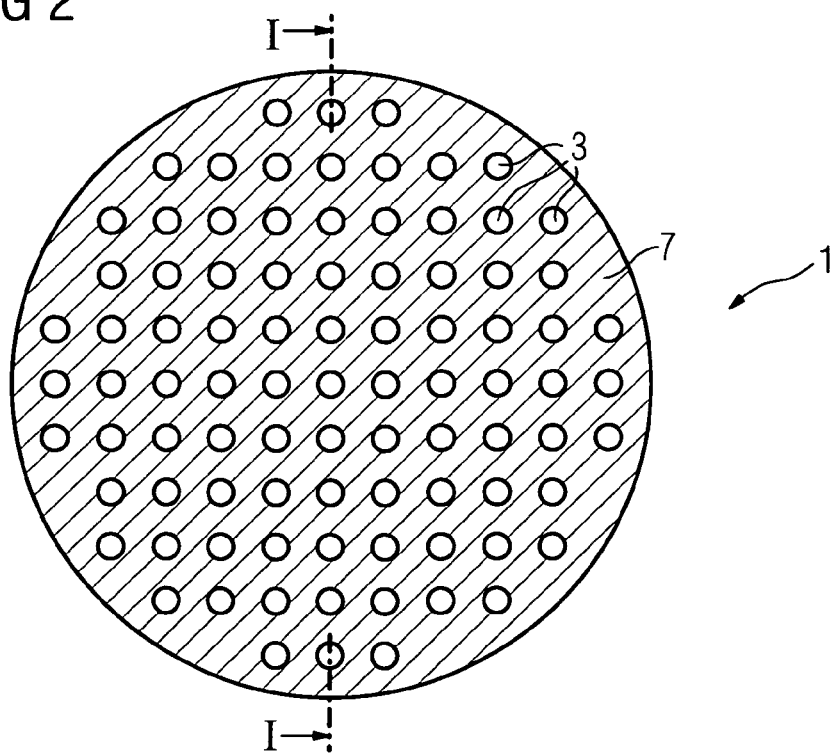

FIG. 1 and FIG. 2 show a longitudinal section and a cross section, respectively, through a phantom 1 such as that which is used for correcting geometric distortions in the case of an MRT device. The broken lines I-I and II-II indicate the location of the longitudinal section or cross section in each case.

The lattice-forming structures are formed of spheres 3 in the phantom 1. In the phantom 1 shown here, the spheres 3 are designed as hollow spheres which are filled with water. In order to facilitate filling, the spheres 3 are connected via hollow rods 5 such that water can be filled through these. In this case the spheres 3 are embedded in polymethyl methacrylate 7 which is represented in a manner that can be distinguished from water in an MRT picture.

In order to facilitate filling of the spheres 3 and the hollow rods 5 with water, the hollow rods 5 which are located at an end of the phantom 1 are connected together by means of a large hollow space 6 which appears rectangular in cross section. On its upper side, this hollow space 6 has a space separator 8 which protrudes into the hollow space 6. There is consequently a partially separated region 9 in the hollow space 6. If air bubbles develop in the spheres 3 and hollow rods 5 when these are filled with water, said air bubbles can be collected and captured in the separated region 9 by simply rotating and turning the phantom 1.

The phantom 1 shown here is dimensioned such that it completely covers the imaging volume of a head coil and, by virtue of its lattice structure of 826 spheres 3 having a diameter of 12 mm, completely allows the geometric distortions to be determined. Specifically in the case of MRT pictures of the brain, correct representation of the geometric ratios is often necessary, e.g. for statements concerning a possible atrophy in the diagnosis of Alzheimer-related conditions. However, if other bodily regions are to be depicted using other coils, the phantom can also be embodied accordingly and adapted in its dimensioning to the coils which are used.

The method which is disclosed here for determining midpoints is based on the fact that the lattice-forming structures in the phantom 1—in this case spheres 3—are essentially point-symmetrical about the sphere midpoint. However, it also functions in the case of all other structures, e.g. cuboids or ellipsoids, provided the structures feature a point symmetry in relation to a point.

In an image of the phantom 1, by identifying the coordinates of the images of the spheres 3 and then comparing the positions of the spheres 3 in the phantom 1, it is possible to establish the extent to which an MRT device distorts the lattice structure contained in the phantom 1 in the case of a specific recording sequence. The midpoints of the images of the point-symmetrical structure are preferably suitable as coordinates in the case of point-symmetrical structures.

In order to allow the systematic capture, with the help of the phantom 1, of the distortions which can occur in the case of different sequences when using an MRT device, it is necessary automatically to analyze many images which are generated by the phantom 1 using different sequences in each case. In particular, a method is required which allows the midpoints of the spheres 3 to be determined automatically and reliably.

Figure 3:
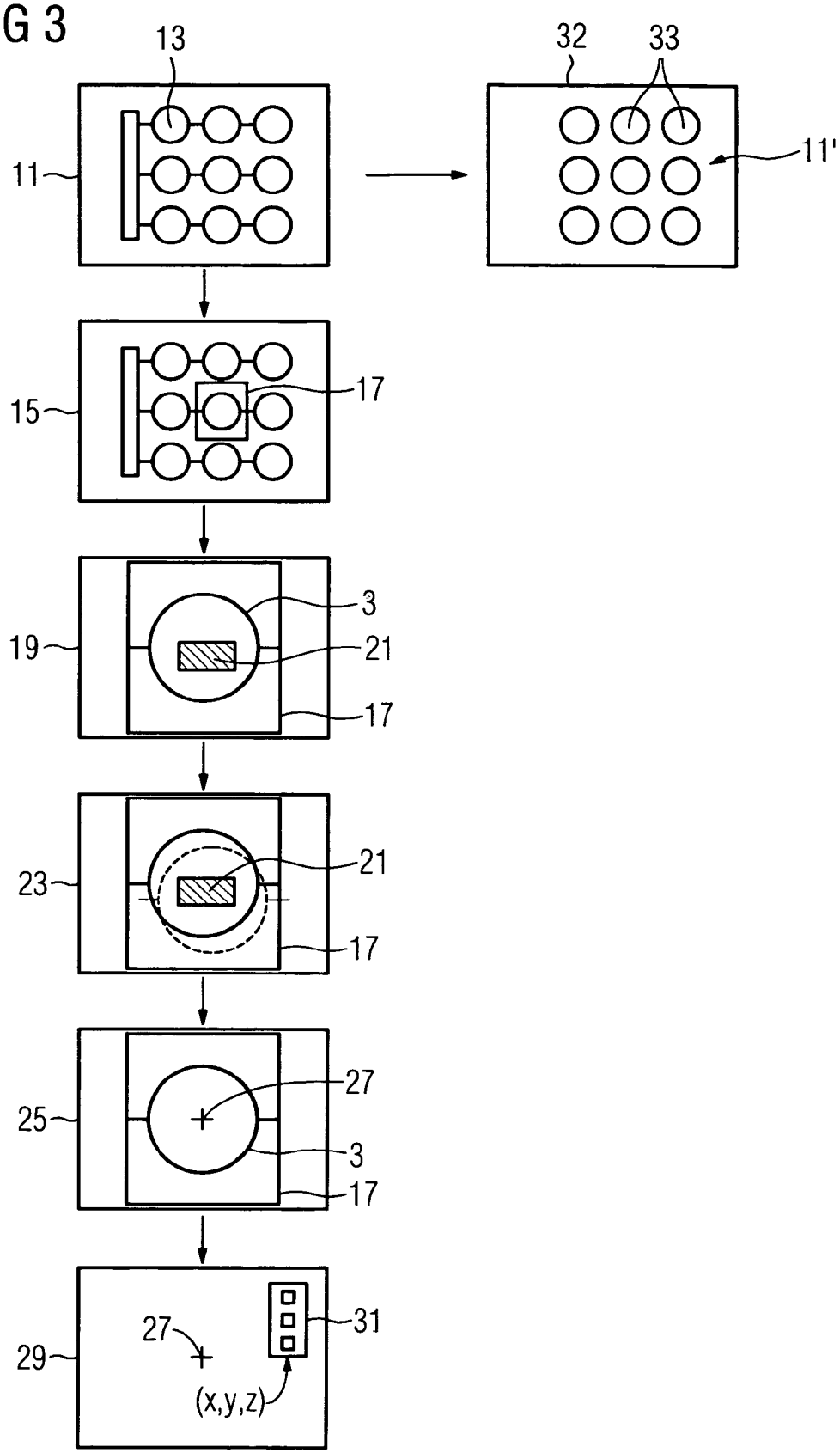

FIG. 3 schematically illustrates the method steps by means of which the automatic determination of the coordinates of the midpoints of the spheres is carried out.

The starting point of the method is a volume data record 11 in which is stored the three-dimensional image 13 of the phantom 1. In a first method step 15, a partial volume data record 17 which essentially contains the image of just one of the spheres 3 of the phantom 1 is extracted from the volume data record 11. In a second method step 19, a set 21 of points which are considered as possible midpoints of the sphere 3 is selected from the partial volume data record 17. In a third method step 23, a measure is determined for each point of this set 21, wherein the measure characterizes the symmetry of the partial volume data record 17 in relation to said point. In a fourth method step 25, on the basis of the previously determined measure, that point of the set 21 with reference to which the partial volume data record 17 has the greatest symmetry is selected as midpoint 27 of the sphere 3. In a fifth method step 29, the coordinates of the midpoint 27 are stored in a computer unit 31 for further processing.

These method steps 15, 19, 23, 25, 29 are advantageously iterated until the coordinates of all sphere midpoints of the phantom 1 have been determined. In this case the partial volume data record 17 is selected in the first method step 15 such that in each case it contains the image of a different sphere 3 for determining the midpoint in each iterative step.

Before the first method step 15 is applied, the volume data record 11 is preferably subjected to a preprocessing step 32 in which all structures which are not images of the spheres 3 are removed from the volume data record 11. As a result of this, the images of the spheres 3 are presented as well-separated structures 33 in the preprocessed volume data record 11'. The first method step 15, in which a partial volume data record 17 is selected, can therefore be automated easily since the location of a sphere 3 in the volume data record 11 can be determined easily on the basis of the separated structures 33 in the preprocessed volume data record 11'.

Figure 4:
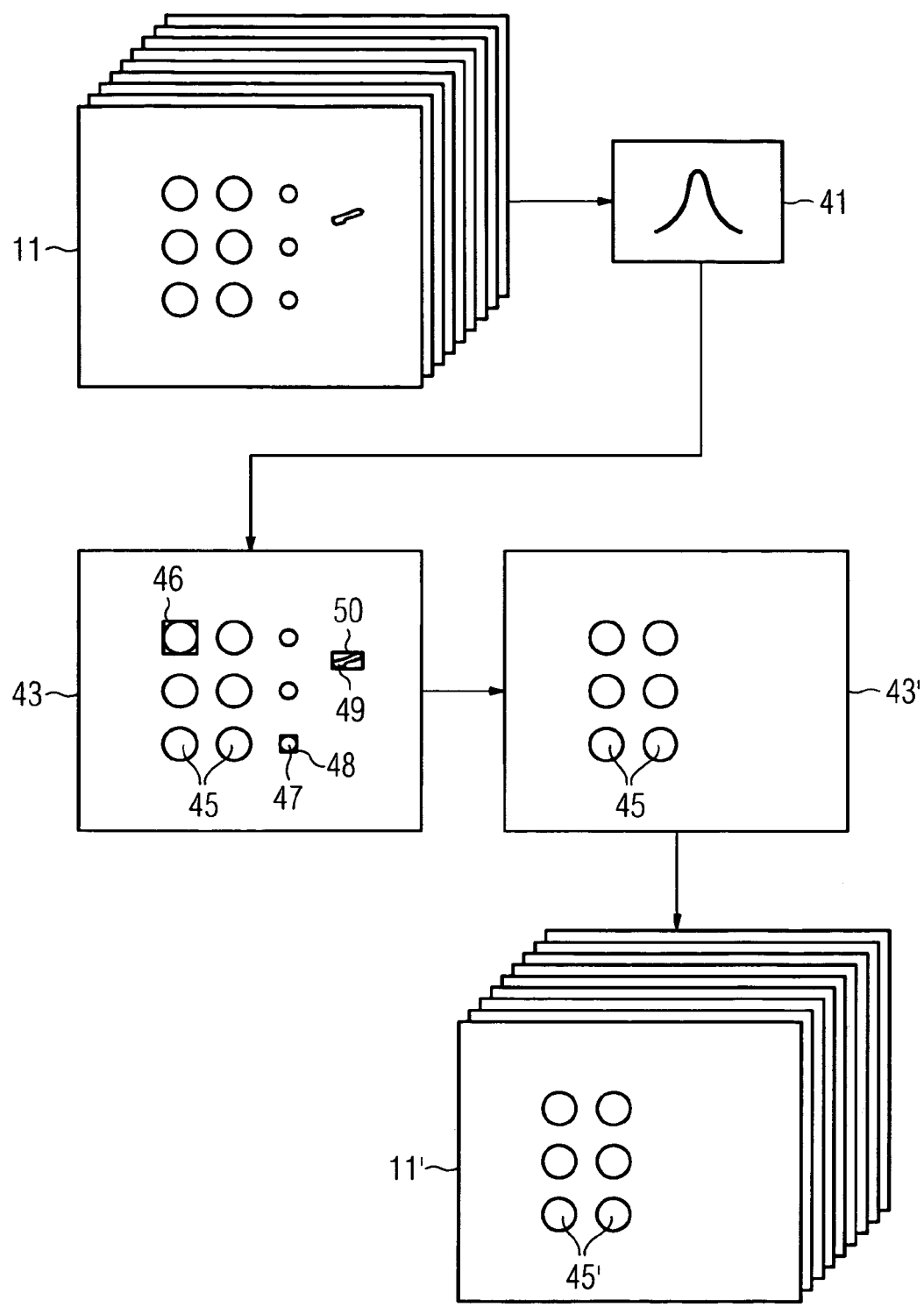
FIG. 4 shows the method step in which structures that do not correspond to the images of the spheres are removed from the volume data record.

FIG. 4 explains the preprocessing step 32 in greater detail. The objective is to obtain the spheres 3 as structures 33 which are clearly separate and differentiable in the preprocessed volume data record 11'.

This is achieved by extracting two-dimensional layer pictures 43 from the volume data record 11, which is first filtered using a Gaussian filter 41. The color depth of each of the two-dimensional layer pictures 43 is then converted into a black/white picture, i.e. into a picture having a color depth of 1 bit, by means of a threshold value algorithm. Use is preferably made of a threshold value algorithm such as that disclosed in Otsu, N: "A threshold selection method from gray level histograms", IEEE Transactions on Systems, Man, and Cybernetics, 9, 62-66, 1979. For the sake of clarity, this method step is not illustrated.

As a result of this operation, associated structures 45, 47, 49 can easily be identified in a two-dimensional layer picture 43. Each of these associated structures 45, 47, 49 is then evaluated with reference to its geometry and removed from the two-dimensional layer picture 43 if its geometry lies outside of a previously defined tolerance range, this being adapted to the shape and size of the spheres 3. In this way, structures 45 remain if they are images of a sphere 3. On the other hand, structures 47, 49 are removed if they are assigned to another structure which is unwanted when determining the coordinates, e.g. the hollow rods 5, or if they have remained in the two-dimensional layer picture 43 as a result of noise artifacts.

In the exemplary embodiment shown here, the geometry of an associated structure 45, 47, 49 is evaluated on the basis of its bounding box 46, 48, 50 and on the basis of its pixel count. On the basis of these variables it is decided whether the structure 45 is considered to be a sphere 3 and therefore remains in the two-dimensional layer picture 43 or whether the structure 47, 49 is removed from the two-dimensional layer picture 43.

In a next step, the two-dimensional layer pictures 43' which have been pruned in this way are combined again to form a three-dimensional volume data record 11'. As a result of this combination, three-dimensional associated clusters 45' are produced from the remaining two-dimensional structures. Also at this point, and again on the basis of the geometry of the three-dimensional cluster 45', it is decided whether or not it can be assigned to a sphere 3—and hence whether or not it remains in the volume data record 11'. Decision criteria in the exemplary embodiment which is described here are the depth, the position and the skewness of the three-dimensional cluster 45'. For the sake of clarity the method step for evaluating and removing three-dimensional clusters 45' is not illustrated, but takes place analogously to the removal of associated structures 45, 47, 49 in a two-dimensional layer picture 43.

These criteria, in particular the criteria by means of which three-dimensional structures 45' are removed from the volume data record 11', are adapted to the specific requirements of three-dimensional MRT imaging and to the specific structure of the phantom 1. Thus, the criterion of the depth characterizes the size of a three-dimensional cluster 45'. The criterion of the position of the three-dimensional cluster 45' makes it possible to identify and eliminate images of spheres 3 which are situated too close to the edge of the picture and occur in the picture volume due to so-called "wrap-around" effects without being the correct image of a sphere. The criterion of the skewness determines three-dimensional clusters 45' which are images of skew—and hence unusable—spheres 3, caused e.g. by trapped air in the water-containing spheres 3 of the phantom 1.

However, if other imaging systems and other phantom structures are used, in particular other shapes of the point-symmetrical structures, it is advantageous to adapt the geometrical criteria, on the basis of which structures are removed from the volume data record, to the specific conditions of the imaging system, the phantom which is used, and the shape and size of the point-symmetrical structures.

Following the preprocessing of the volume data record 11, the three-dimensional images of the lattice-forming phantom structures, in this specific case the spheres 3, are present as clearly separate and differentiable structures 33 in the preprocessed volume data record 11'. On the basis of these separable and differentiable structures 33, it is now easily possible to determine the locations of the images of the spheres 3. It is therefore possible to arrange partial volume data records 17 such that essentially only the image of one sphere 3 is completely contained in the partial volume data records 17. The partial volume data record 17 can still also contain parts of the hollow rods 5 which are connected to the sphere 3. This does not interfere with the point symmetry of the image of the sphere 3.

After a partial volume data record 17 has been extracted from the volume data record 11, it is possible to apply a method which, in the partial volume data record 17 which contains exactly one image of a sphere 3, detects the midpoint 27 (and hence also its coordinates) of this sphere 3.

For this purpose, a set 21 of points from the partial volume data record 17 is initially selected as possible midpoints. The midpoint 27 of the sphere 3 is characterized by that midpoint, of the possible midpoints, with reference to which the partial volume data record 17 has the greatest possible symmetry.

The set 21 of points can also include points which do not exactly correspond to the coordinates of a voxel of the partial volume data record 17, but lie between the voxels of the partial volume data record 17. As a result, the symmetry of the sphere 3 can also be tested and established in a resolution which lies below the resolution which is predetermined by the voxels. Determining the coordinates of the midpoints 27 takes place in the sub-voxel region, thereby allowing distortion errors of the imaging system to be determined significantly more accurately.

By means of skilful selection of the set 21 of points, the computing time which is required for determining the midpoint 27 of a sphere 3 can be significantly reduced.

Figure 5:
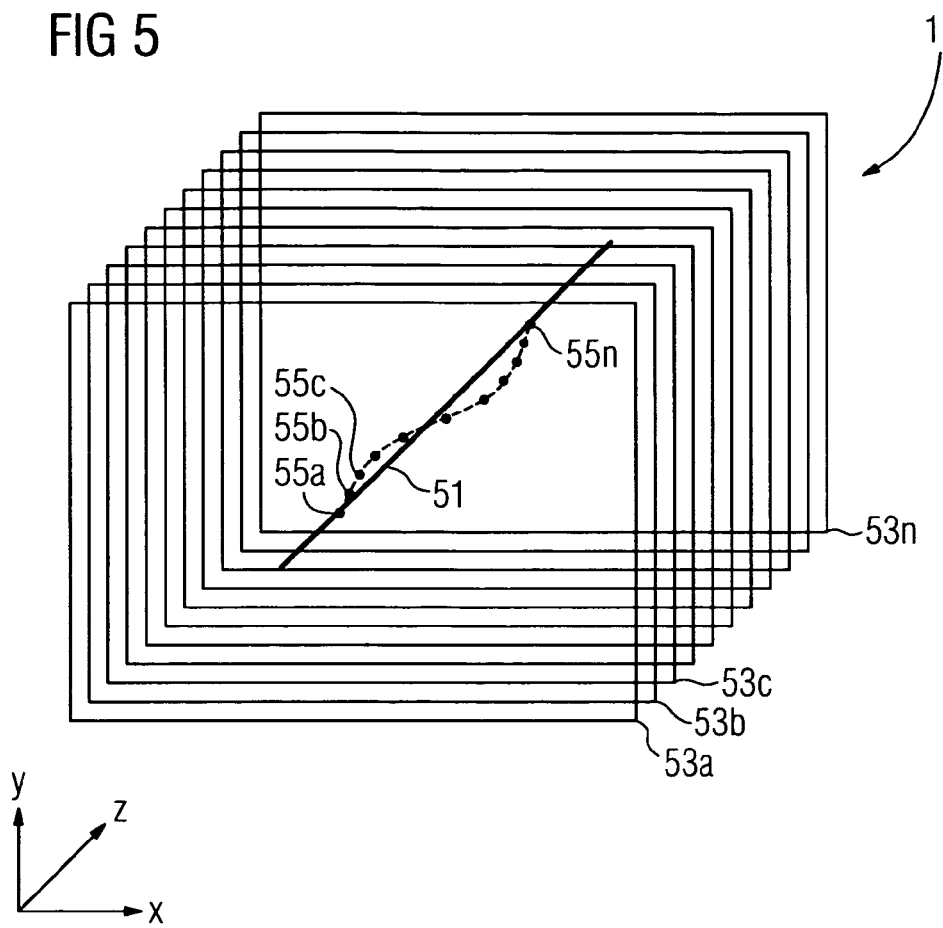
FIG. 5 shows the method step in which specific points that are subsequently tested as possible midpoints are selected from a partial volume data record.

FIG. 5 shows the method step utilized here, in which only the points along a straight line 51 through the partial volume data record 17 are tested as possible midpoints. As a result of restricting the set 21 to points along a straight line 51, i.e. along a one-dimensional structure, there is a significant reduction in the expenditure of computing time.

The selection of the straight line 51 whose points are tested as possible midpoints in this case takes place according to the following method steps. Two-dimensional partial volume layer pictures 53a, 53b . . . 53n are firstly derived from the partial volume data record 17. For simpler understanding of the following explanations, the coordinate axes of the partial volume layer pictures 53a, 53b . . . 53n are designated as the x and y axes, while the direction of the sequence of the two-dimensional partial volume layer pictures 53a, 53b . . . 53n is designated as the z axis.

An intensity-value-weighted center of area 55a, 55b . . . 55n is specified in each of the partial volume layer pictures 53a, 53b . . . 53n. All centers of area 55a, 55b . . . 55n together produce a series of points in the three-dimensional partial volume data record 17, wherein said series of points—depending on the position and distortion of the image of a sphere 3—can be curved and deviates clearly from the midline of the three-dimensional image of the sphere 3. Consequently, the centers of area 55a, 55b . . . 55n are not suitable as possible midpoints of the image of the sphere 3.

However, if the straight line 51 is positioned as a regression line in three dimensions at the centers of area 55a, 55b . . . 55n, the misalignment of the series of points, said misalignment being caused by the distortion of the image of the sphere 3, is largely counterbalanced.

Figure 6:
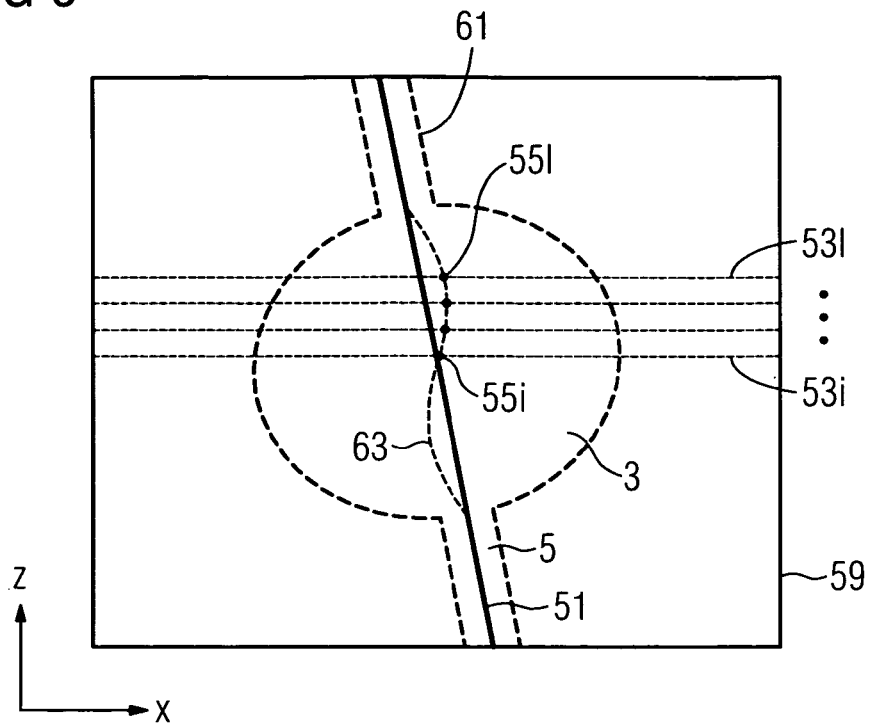
FIG. 6 shows the positioning of a two-dimensional regression line at intensity-value-weighted centers of area which were specified beforehand in layer pictures of the partial volume data record.

This fact is clarified again in FIG. 6 with reference to a two-dimensional projection 59 of the partial volume data record 17 on the x-z plane. The image 61 of a sphere 3 having the hollow rod 5 is outlined in the projection 59. Some of the two-dimensional partial volume layer pictures 53i . . . 53l are indicated as lines. Due to the skew position of the image 61 and the distortion which distorts the sphere 3 in an elliptical manner, the centers of area 55i . . . 55l lie along a snaking line 63. As a result of positioning a straight line 51 as a regression line at the centers of area 55, this distortion-related effect is balanced out.

The positioning of the straight line 51 as a three-dimensional regression line in the partial volume data record 17 is done by positioning two regression lines in the two dimensions, respectively in the x-z plane and in the y-z plane. FIG. 6 illustrates the positioning of the straight line 51 as a two-dimensional regression line at the x coordinate of the centers of area depending on the z coordinate. As in the case of the x-z plane, a regression line in the y-z plane can be positioned at the centers of area. The three-dimensional regression line is produced from a combination of the x coordinates and the y coordinates of the two two-dimensional regression lines depending on z coordinates.

Figure 7:
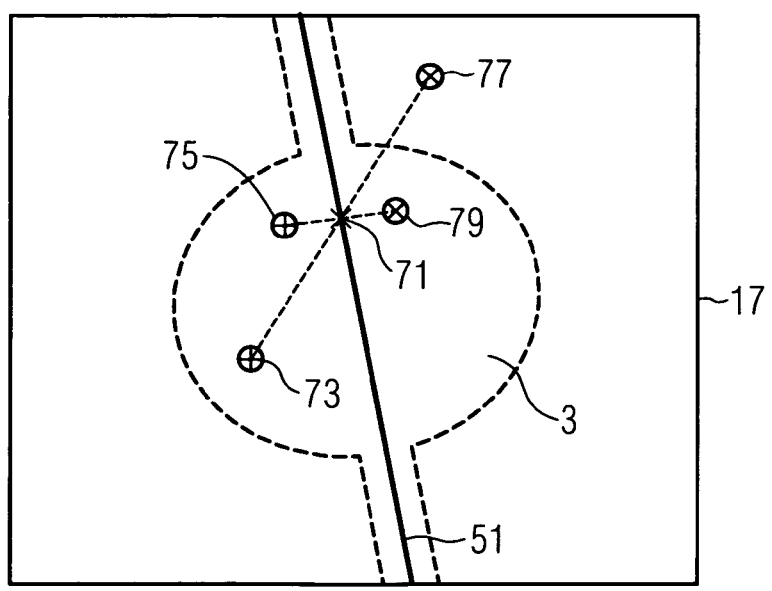
FIG. 7 shows the mirroring of voxels at a point which is tested as a possible midpoint of the sphere.

In a next method step, the points of the straight line 51 are tested to ascertain the extent of the point symmetry of the partial volume data record 17 in relation to each point of the straight line 51. FIG. 7 illustrates the method for determining a measure for the point symmetry of the partial volume data record 17 with reference to a specific point 71. For the sake of clarity, this is shown in two dimensions.

In order to obtain a measure for the point symmetry of the partial volume data record 17 for a specific point 71, each voxel of the partial volume data record 17 is mirrored at this point 71. The intensity value at the location of the mirrored voxel is then compared with the intensity value at the location of the original voxel. The closer the point 71 lies to the point of symmetry of the structure (the sphere midpoint in this case), the more voxels will have similar intensity values in respect of their location and their mirrored location. From the multiplicity of voxels, for the purpose of illustration two voxels 73, 75 which lie inside the image of the sphere 3 are picked out and mirrored at the point 71. In the case of one of the two voxels 75, the mirrored voxel 79 again lies within the image of the sphere 3. The two associated intensity values are therefore similar. In the case of the other of the two voxels 73, the mirrored voxel 77 lies outside of the image of the sphere 3, and therefore in a region which has intensity values that are clearly different to those of the image of the sphere 3. The closer the point 71, in relation to which the symmetry is tested, lies to the midpoint of the sphere 3, the more seldom the latter case will occur.

If the partial volume data record 17 is mirrored at a point which lies too close to the edge of the partial volume data record 17, this can result in a majority of the mirrored voxels lying outside of the partial volume data record 17 such that the comparison of the intensity value with the intensity value at the location of the mirrored voxel cannot be carried out in the case of these voxels. Consequently, the comparison of the partial volume data record 17 with the mirrored partial volume data record is preferably only carried out for points in respect of which a majority of the mirrored voxels again come to lie in the partial volume data record 17.

In order to obtain a measure for the symmetry of the partial volume data record 17 in relation to a point 71, the intensity value differences from voxels 73, 75 and mirrored voxels 77, 79 are calculated then squared and summed for all voxels of the partial volume data record. This measure becomes minimal for a specific point, namely for the midpoint 27 of the sphere 3.

However, other types of evaluation of the intensity value differences can be carried out on the basis of different types of similarity measures such as are used in the context of image processing. For example, instead of the squares of the intensity value differences, their absolute values can likewise be summed.

Figure 8:
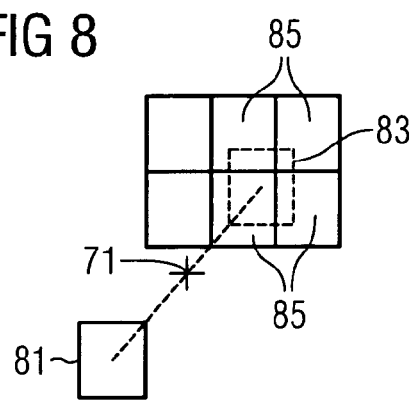
FIG. 8 shows the interpolation of the intensity value at the location of a mirrored voxel.

FIG. 8 illustrates in greater detail the method step of mirroring a voxel and determining the intensity value at the mirrored location of the voxel. The point 71 at which a voxel 81 is mirrored need not necessarily have the coordinates of a voxel. Consequently, the location of the mirrored voxel 83 also need not necessarily coincide with exactly one voxel of the partial volume data record 17. In this case, the intensity value at the location of the mirrored voxel 83 is interpolated from the intensity values of the surrounding voxels 85.

The invention claimed is:

1. A method for determining coordinates of a midpoint of a medical image having a point-symmetrical structure stored in a volume data record, comprising:
   extracting a portion of the volume data record containing the image of the point-symmetrical structure;
   selecting a set of points having coordinates lying in the portion of the volume data record;
   measuring a symmetry of the portion of the volume data record with respective to each of the set points;
   identifying a point from the set points as the midpoint of the point-symmetrical structure based on the measuring; and
   storing the coordinates of the midpoint in a computer unit.

2. The method as claimed in claim 1, wherein the volume data record is filtered before the extracting step.

3. The method as claimed in claim 1, wherein the set of points is a subset of voxels of the portion of the volume data record located around a volume central area of the portion of the volume data record.

4. The method as claimed in claim 3, wherein the midpoint is identified in a resolution which is less than a resolution predetermined by the voxels.

5. The method as claimed in claim 1, wherein the set of points lie on a straight line.

6. The method as claimed in claim 5,
   wherein a plurality of two-dimensional layer pictures are extracted from the portion of the volume data record,
   wherein a plurality of intensity-value-weighted centers of area are determined for each of the two-dimensional layer pictures respectively, and
   wherein the straight line is positioned as a regression line at the intensity-value-weighted centers of area.

7. The method as claimed in claim 1, wherein the symmetry of the portion of the volume data record for a point of the set points is measured by:
   mirroring the portion of the volume data record with respective to the point, and
   evaluating a similarity between the portion of the volume data record and the mirrored portion of the volume data record.

8. The method as claimed in claim 7, wherein the portion of the volume data record comprises a voxel having an intensity value and the evaluating is performed by comparing the intensity value of the voxel with an intensity value of a mirrored voxel that is a mirroring of the voxel with resective to the point.

9. The method as claimed in claim 8, wherein the intensity value of the mirrored voxel is calculated by interpolating from intensity values of voxels surrounded the mirrored voxel.

10. The method as claimed in claim 8, wherein the similarity between the portion of the volume data record and the mirrored portion of the volume data record is calculated based on a difference from the intensity value of the voxel and the intensity value of the mirrored voxel.

11. The method as claimed in claim 1, wherein a plurality of images comprising a plurality of point-symmetrical structures respectively are stored in the volume data record and coordinates of a midpoint for each of the point-symmetrical structures are determined.

12. The method as claimed in claim 11,
   wherein the volume data record is preprocessed prior to the extracting step,
   wherein the point-symmetrical structures are differentiable from an interfering structure in the preprocessed volume data record, and
   wherein a portion of the volume data record containing one of the images of one of the point-symmetrical structures respectively is automatically selected and extracted based on the preprocessed volume data record.

13. The method as claimed in claim 12, wherein the interfering structure with a geometry lying outside of a tolerance range of the point-symmetrical structures is removed from the volume data record during the preprocessing.

14. The method as claimed in claim 13, wherein the tolerance range is adapted to a geometry of the point-symmetrical structures.

15. The method as claimed in claim 13, wherein the interfering structure is removed from a two-dimensional layer picture of the volume data record.

16. The method as claimed in claim 13, wherein the interfering structure is removed from a three-dimensional volume data record.

17. The method as claimed in claim 11, wherein the point-symmetrical structures are a spherical structure.

18. The method as claimed in claim 11, wherein the point-symmetrical structures are arranged in a phantom.

19. The method as claimed in claim 18, wherein the phantom is a magnetic resonance tomography image.

20. A device for determining coordinates of a midpoint of a medical image having a point-symmetrical structure stored in a volume data record, comprising:
   an image recording unit that records the volume data record;
   a data processing unit that is configured to:

extract a portion of the volume data record containing the image of the point-symmetrical structure,
select a set of points whose coordinates lie in the portion of the volume data record,
measure a symmetry of the portion of the volume data record with respective to each of the set points, and identify a point from the set points as the midpoint of the point-symmetrical structure based on the measuring; and a storage unit that stores the coordinates of the midpoint.

* * * * *